(12) United States Patent
Chang et al.

(10) Patent No.: US 10,269,743 B2
(45) Date of Patent: Apr. 23, 2019

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Kuei-Sung Chang, Kaohsiung (TW); Nien-Tsung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/011,122

(22) Filed: Jan. 29, 2016

(65) Prior Publication Data
US 2017/0221843 A1    Aug. 3, 2017

(51) Int. Cl.
*H01L 21/44* (2006.01)
*H01L 23/00* (2006.01)
(Continued)

(52) U.S. Cl.
CPC .............. *H01L 24/09* (2013.01); *H01L 24/03* (2013.01); *H01L 24/05* (2013.01); *H01L 24/48* (2013.01); *H01L 24/85* (2013.01); *H01L 25/0655* (2013.01); *H01L 25/0657* (2013.01); *H01L 25/50* (2013.01); *H01L 2224/036* (2013.01); *H01L 2224/0345* (2013.01); *H01L 2224/0361* (2013.01); *H01L 2224/0391* (2013.01); *H01L 2224/03452* (2013.01); *H01L 2224/03618* (2013.01); *H01L 2224/03826* (2013.01); *H01L 2224/03827* (2013.01); *H01L 2224/0401* (2013.01); *H01L 2224/04042* (2013.01); *H01L 2224/05022* (2013.01); *H01L 2224/05124* (2013.01); *H01L 2224/05147* (2013.01); *H01L 2224/05541* (2013.01); *H01L 2224/05558* (2013.01); *H01L 2224/05567* (2013.01); *H01L 2224/05686* (2013.01);
(Continued)

(58) Field of Classification Search
CPC . H01L 2224/48247; H01L 2224/48263; H01L 24/49; H01L 2224/04042; H01L 2224/48465; H01L 24/45
USPC ........................................ 438/106, 117, 617
See application file for complete search history.

(56) References Cited

U.S. PATENT DOCUMENTS 5,595,934 A * 1/1997 Kim ................ H01L 24/03
                                                257/E23.02
5,814,893 A * 9/1998 Hsu ................ H01L 21/2007
                                                257/784
(Continued)

OTHER PUBLICATIONS

Lum, I., et al., "Bonding Mechanism in Ultrasonic Gold Ball Bonds on Copper Substrate," Metallurgical and Materials Transactions A, vol. 36A, Issue 5, May 2005, pp. 1279-1286.
(Continued)

*Primary Examiner* — S. V. Clark
(74) *Attorney, Agent, or Firm* — Slater Matsil, LLP

(57) ABSTRACT

Semiconductor devices and methods of manufacture thereof are disclosed. In some embodiments, a method includes forming a contact pad over a semiconductor device. A passivation material is formed over the contact pad. The passivation material has a thickness and is a type of material such that an electrical connection may be made to the contact pad through the passivation material.

20 Claims, 12 Drawing Sheets

(51) Int. Cl.
*H01L 25/065* (2006.01)
*H01L 25/00* (2006.01)

(52) U.S. Cl.
CPC ............... *H01L 2224/11334* (2013.01); *H01L 2224/131* (2013.01); *H01L 2224/13007* (2013.01); *H01L 2224/13021* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01); *H01L 2224/48137* (2013.01); *H01L 2224/48145* (2013.01); *H01L 2224/48228* (2013.01); *H01L 2224/49109* (2013.01); *H01L 2224/49173* (2013.01); *H01L 2225/0651* (2013.01); *H01L 2924/00014* (2013.01); *H01L 2924/01014* (2013.01); *H01L 2924/01022* (2013.01); *H01L 2924/0132* (2013.01); *H01L 2924/01072* (2013.01); *H01L 2924/01073* (2013.01); *H01L 2924/04941* (2013.01); *H01L 2924/04953* (2013.01); *H01L 2924/0535* (2013.01); *H01L 2924/05341* (2013.01); *H01L 2924/05432* (2013.01); *H01L 2924/14* (2013.01); *H01L 2924/206* (2013.01)

(56) References Cited

U.S. PATENT DOCUMENTS

| 2004/0115942 | A1* | 6/2004 | Lee | H01L 24/03 438/690 |
| 2013/0048982 | A1* | 2/2013 | Patti | H01L 22/34 257/48 |
| 2014/0110838 | A1* | 4/2014 | Rogalli | H01L 24/05 257/738 |

OTHER PUBLICATIONS

"Wire Bonding," Wikipedia, https://en.wikipedia.org/wiki/Wire_bonding, last modified Jun. 5, 2015, 3 pages.

* cited by examiner

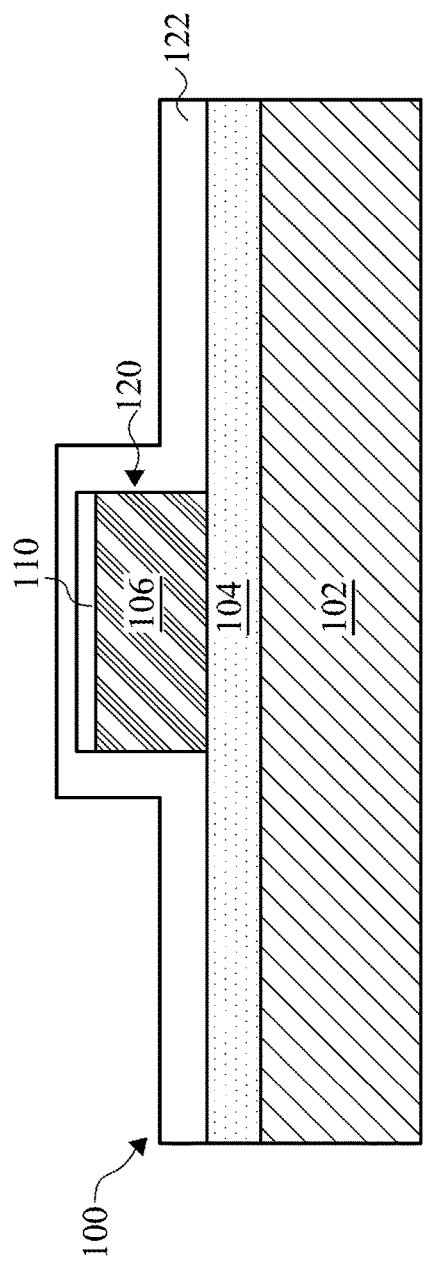
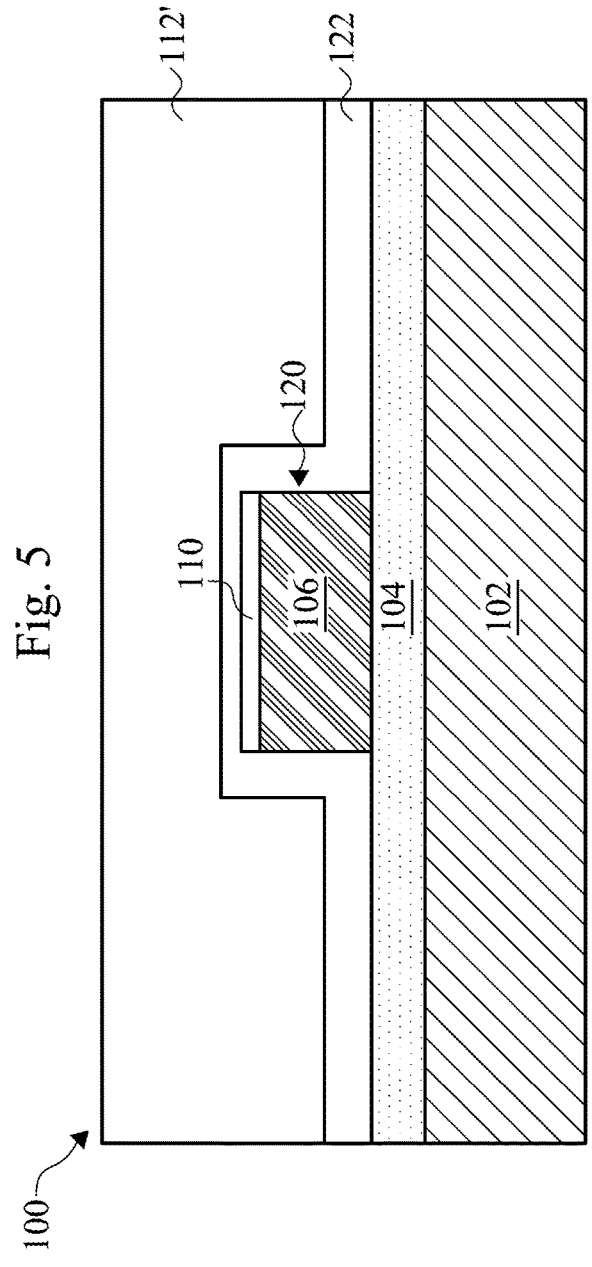

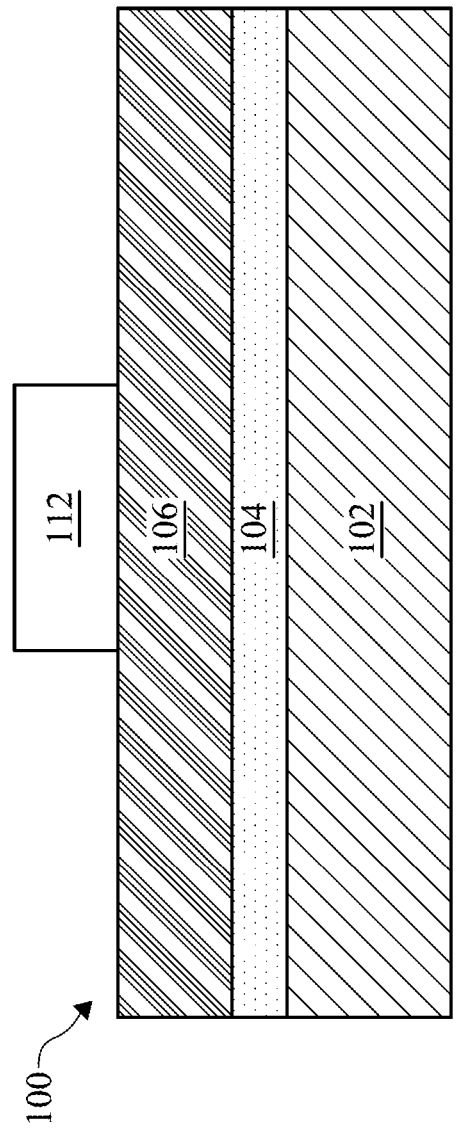
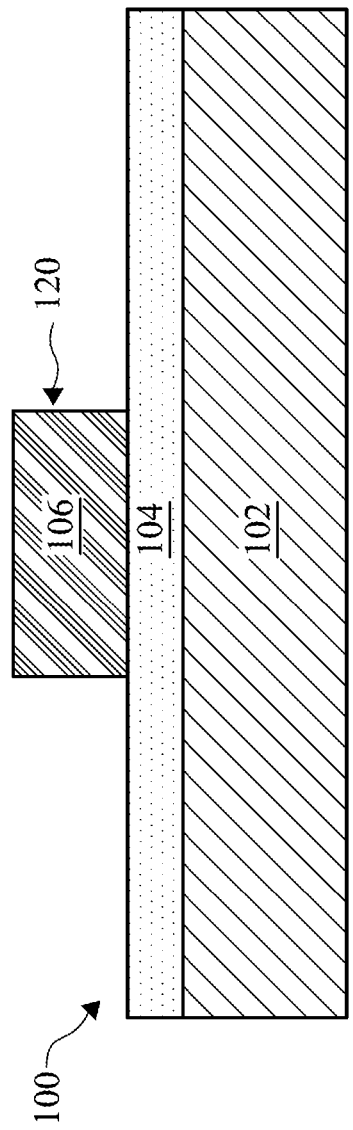

US 10,269,743 B2

SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuit dies are typically manufactured on a single semiconductor wafer. The individual integrated circuit dies are singulated by sawing the integrated circuit dies along scribe lines. The individual integrated circuit dies are then packaged separately, in multi-chip modules, or in other types of packaging.

Contact pads are used to make electrical connections to integrated circuit dies in some applications. The contact pads are formed on the integrated circuit dies and are connected to underlying circuitry. Electrical connections may be made to the contact pads of integrated circuit dies by wire bonds, connectors, or other types of devices. Packages for integrated circuit dies may also include contact pads that are used for making electrical connections to the packaged integrated circuit dies, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 8 are cross-sectional views of a semiconductor device at various stages of manufacturing that illustrate a method of forming a contact pad in accordance with some embodiments of the present disclosure.

FIGS. 15 through 21 are cross-sectional views of a semiconductor device at various stages of manufacturing that illustrate a method of forming a contact pad in accordance with some embodiments of the present disclosure.

DETAILED DESCRIPTION

Figure 1:
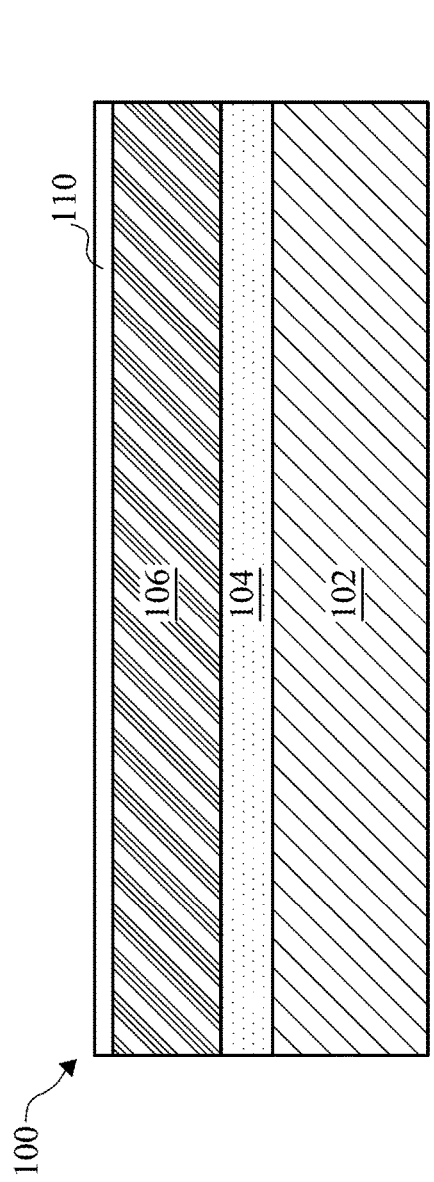

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of manufacture thereof are disclosed in the present disclosure. A passivation material is formed over contact pads of the semiconductor devices, which advantageously prevents or reduces corrosion of the contact pads, and maintains bondability of the contact pads. The passivation material is thin enough that electrical connections may be made to the contact pads through the passivation material. Some embodiments are disclosed that utilize contact pads that may be used for the purpose of attaching one substrate to another substrate, wherein the substrates may comprise a die, printed circuit board (PCB), packaging substrate, or the like, thereby allowing for die-to-die, die-to-PCB, die-to-substrate, die-to-packaging substrate, or the like types of electrical connections. Throughout the various views and illustrative embodiments, like reference numerals are used to designate like elements.

FIGS. 1 through 8 are cross-sectional views of a semiconductor device 100 at various stages of manufacturing that illustrate a method of forming a contact pad 120 (see FIG. 4) in accordance with some embodiments of the present disclosure. One contact pad 120 is illustrated in some of the drawings; however, a plurality of contact pads 120 are formed over a surface of a semiconductor device 100 in accordance with some embodiments.

Referring first to FIG. 1, in some embodiments, a substrate 102 is provided. The substrate 102 comprises an integrated circuit die (not shown in FIG. 1: see integrated circuit die 130 shown in FIGS. 11, 12, and 14) having circuitry formed within or thereon, in some embodiments. In some embodiments, the substrate 102 comprises a packaged integrated circuit die, a package for an integrated circuit die, a packaging substrate, or a PCB, as other examples. The substrate 102 may also comprise a micro-sensor, a micro-actuator, or a micro-electromechanical system (MEMS) device in some embodiments, as examples. The substrate 102 may comprise a stack of two or more wafers, such as a bonded wafer stack in some embodiments, for example. The substrate 102 may also comprise other types of devices wherein contact pads will be formed over the substrate 102 to make electrical connection to portions of the substrate 102, for example.

In some embodiments wherein the substrate 102 comprises an integrated circuit die, the substrate 102 may comprise, for example, doped or undoped bulk silicon or an active layer of a semiconductor-on-insulator (SOI) substrate. The electrical circuitry of the substrate 102 of the integrated circuit die may be any type of circuitry suitable for a particular application. The integrated circuit die may comprise a logic, memory, processor, or other type of device. As other examples, electrical circuitry formed within or on the substrate of the integrated circuit die may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, and/or the like. One of ordinary skill in the art will appreciate that the above examples are provided for illustrative purposes to further explain applications of some illustrative embodiments and are not meant to limit the disclosure in any manner. Other circuitry may be used as appropriate for a given application. The integrated circuit die formed within or on the substrate 102 typically is fabricated by forming a plurality of integrated circuit dies on a semiconductor wafer, and the individual integrated circuit dies are later singulated along scribe lines, for example, not shown.

In some embodiments, the substrate 102 includes an interconnect structure (not shown in FIG. 1: see interconnect structure 132 shown in FIGS. 11, 12, and 14) disposed proximate a top surface thereof. The interconnect structure may comprise a plurality of conductive lines, conductive vias, and other conductive features that are formed in one or more insulating material layers. In accordance with some embodiments, a top metal layer comprising a plurality of contact pads (see contact pad 120 shown in FIG. 4) is formed over the interconnect structure disposed proximate the top surface of the substrate 102. The interconnect structure may include a via, conductive line, or conductive feature (not shown) disposed in an upper-most insulating material layer of the substrate 102 that is adapted to make electrical contact and connection to the contact pad 120. The via, conductive line, or conductive feature is coupled to electrical circuitry within the substrate 102 by other portions of the interconnect structure, for example.

An insulating material 104 is formed over the substrate 102, also illustrated in FIG. 1. The insulating material 104 comprises an inter-metal passivation layer in some embodiments. The insulating material 104 comprises SiO$_2$ having a thickness of about 0.1 µm to about 10 µm in some embodiments. The insulating material 104 may be formed using chemical vapor deposition (CVD) or physical vapor deposition (PVD), for example. The insulating material 104 may also comprise other materials, dimensions, and formation methods.

A conductive material 106 is formed over the substrate 102 over the insulating material 104. The conductive material 106 comprises a top metal layer of the semiconductor device 100 in some embodiments, for example. The conductive material 106 may comprise an upper-most conductive material layer of the semiconductor device 100 in the view shown in FIG. 1, for example. The conductive material 106 comprises AlCu, AlSi, Al, Cu, or combinations or multiple layers thereof formed by a method such as PVD in some embodiments. The conductive material 106 comprises a thickness of about 0.1 µm to about 10 µm in some embodiments. In some embodiments wherein the conductive material 106 comprises AlCu or AlSi, the conductive material 106 may comprise about 5% or less of Cu or Si, respectively, for example. The conductive material 106 may also comprise other materials, percentages of materials, dimensions, and formation methods.

In some embodiments, first, the conductive material 106 is patterned, and second, a passivation material 110 is formed over the patterned conductive material 106, which will be described further herein with respect to some of the embodiments illustrated in FIGS. 15 through 21. In some embodiments, a passivation material 110 is first formed over the conductive material, and second, the passivation material 110 and the conductive material 106 are simultaneously patterned, as illustrated in FIGS. 1 through 4.

Referring again to FIG. 1, the passivation material 110 is formed over the substrate 102 over the conductive material 106. The passivation material 110 comprises a metal passivation layer disposed over the conductive material 106 that comprises a top metal layer in some embodiments, for example. The passivation material 110 comprises a thickness and a type of material such that an electrical connection may be made to a contact pad 120 (see FIGS. 4 and 9) formed from the conductive material 106 through the passivation material 110 in some embodiments. The passivation material 110 comprises a material that is adapted to prevent or reduce corrosion of a contact pad 120 formed from the conductive material 106 in some embodiments, for example.

The passivation material 110 comprises Ti, TiN, TaN, Al$_2$O$_3$, Ta$_2$O$_3$, HfO$_2$, TiO$_2$, and/or a combination or multiple layers thereof, in some embodiments. The passivation material 110 is formed using PVD or CVD in some embodiments. The passivation material 110 comprises a thickness of about 1,400 Angstroms or less in some embodiments. For example, the passivation material 110 may comprise a thickness of about 10 Angstroms to about 1,400 Angstroms in some embodiments. The passivation material 110 may comprise a thickness of about 50 Angstroms to about 1,400 Angstroms in some embodiments, for example. The passivation material 110 may also comprise a thickness of about 200 Angstroms to about 300 Angstroms in some embodiments, for example. The passivation material 110 may also comprise other materials, formation materials, and dimensions.

Figure 2:
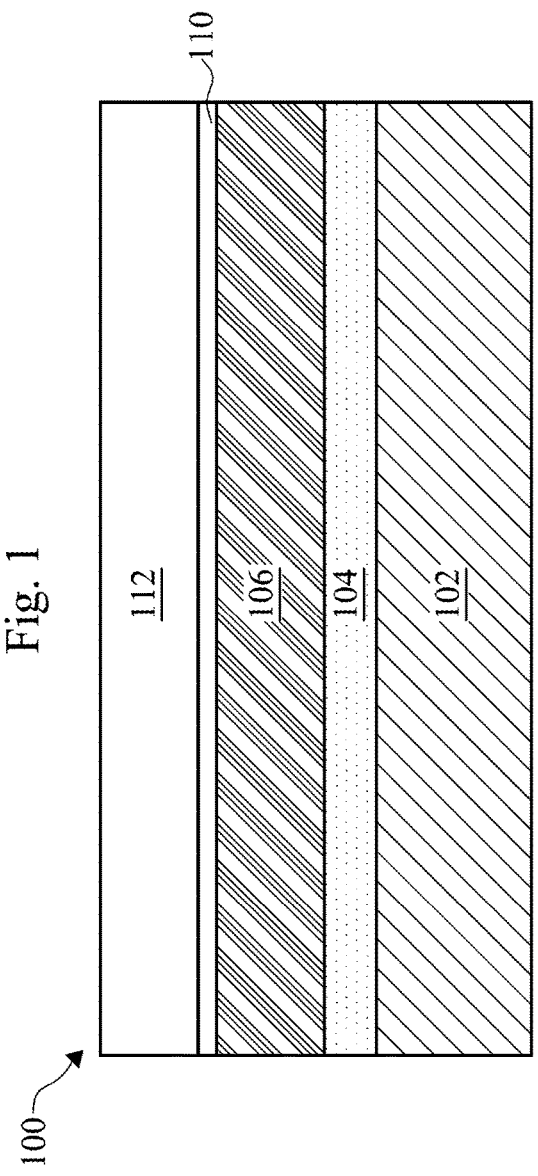
Figure 3:
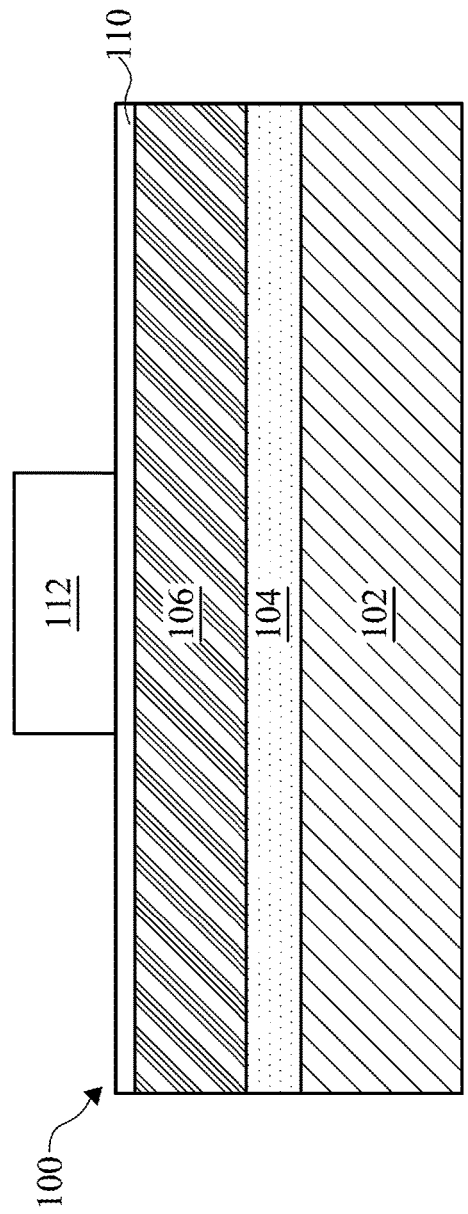

The passivation material 110 and conductive material 106 are then patterned using a lithography process. For example, a layer of photoresist 112 may be deposited over the passivation material 110, as illustrated in FIG. 2. The layer of photoresist 112 is then patterned with a desired pattern for a plurality of contact pads, as illustrated in FIG. 3. For example, the layer of photoresist 112 may be exposed to light or energy transmitted through or reflected from a lithography mask having a desired pattern thereon. The layer of photoresist 112 is developed, and exposed (or unexposed, depending on whether the layer of photoresist 112 comprises a positive or negative photosensitive material) portions of the layer of photoresist 112 are removed using an ashing and/or etch process.

Figure 4:
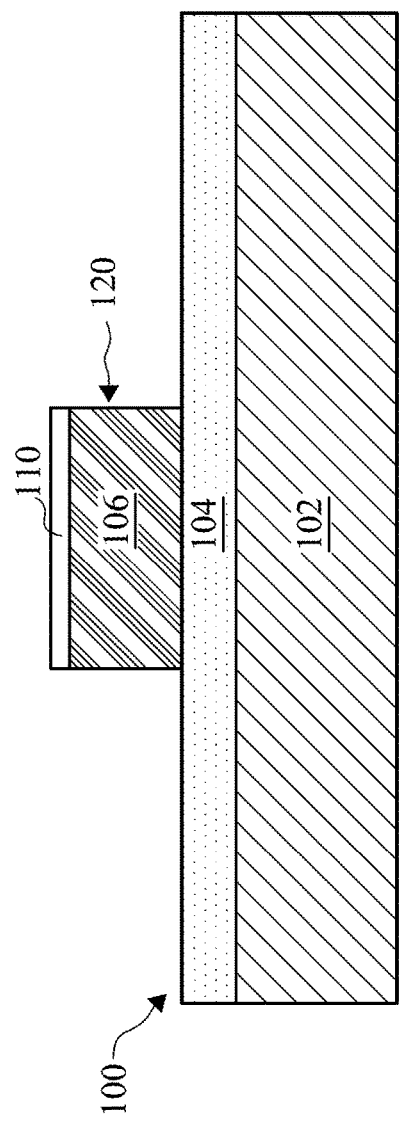

The layer of photoresist 112 is then used as an etch mask during an etch process for the passivation material 110 and conductive material 106, as shown in FIG. 4. The etch process comprises a chemistry suitable for etching the materials of the passivation material 110 and the conductive material 106. The etch process may comprise a dry plasma etch process using Cl$_2$, BCl$_3$, SiCl$_4$, or HBr, or a wet chemical etch process using HNO$_3$, HCl, NaOH, or KOH, as examples. The etch process may also comprise other methods and other chemistries and/or chemical compounds. The layer of photoresist 112 is then removed using a suitable etch process and/or cleaning process, which is also shown in FIG. 4.

A contact pad 120 is formed from the patterned conductive material 106. The contact pad 120 comprises a width of about 30 μm to about 10 μm in some embodiments, for example. The contact pad 120 may also comprise other dimensions. The contact pad 120 may comprise a square or rectangular shape in a top view in some embodiments (e.g., see contact pads 120 shown in a top view FIG. 10). The contact pad 120 may also comprise a circular, oval, polygon, or other shapes in the top view. In some embodiments, the contact pad 120 comprises a wire bond pad. The contact pad 120 comprises a top metal wire bond pad in some embodiments, for example. The contact pad 120 may also comprise other types of pads or conductive landing regions of a semiconductor device 100 in some embodiments.

The passivation material 110 is disposed over a top surface of the contact pad 120. The passivation material 110 comprises substantially the same shape, e.g., length and width, as the contact pad 120 in some embodiments.

An insulating material 122 is formed over the contact pad 120, the passivation material 110, and exposed portions of the insulating material 104, as shown in FIG. 5. The insulating material 122 comprises a top metal passivation layer in some embodiments. The insulating material 122 comprises silicon oxide or silicon nitride deposited by PVD or CVD. The insulating material 122 may have a thickness of about 0.1 μm to about 10 μm in some embodiments. The insulating material 122 may also comprise other materials, formation materials, and dimensions. The insulating material 122 may be substantially conformal to the topography of the semiconductor device 100 in some embodiments, for example. In some embodiments, the insulating material 122 may not be conformal to the topography of the semiconductor device 100.

Figure 7:
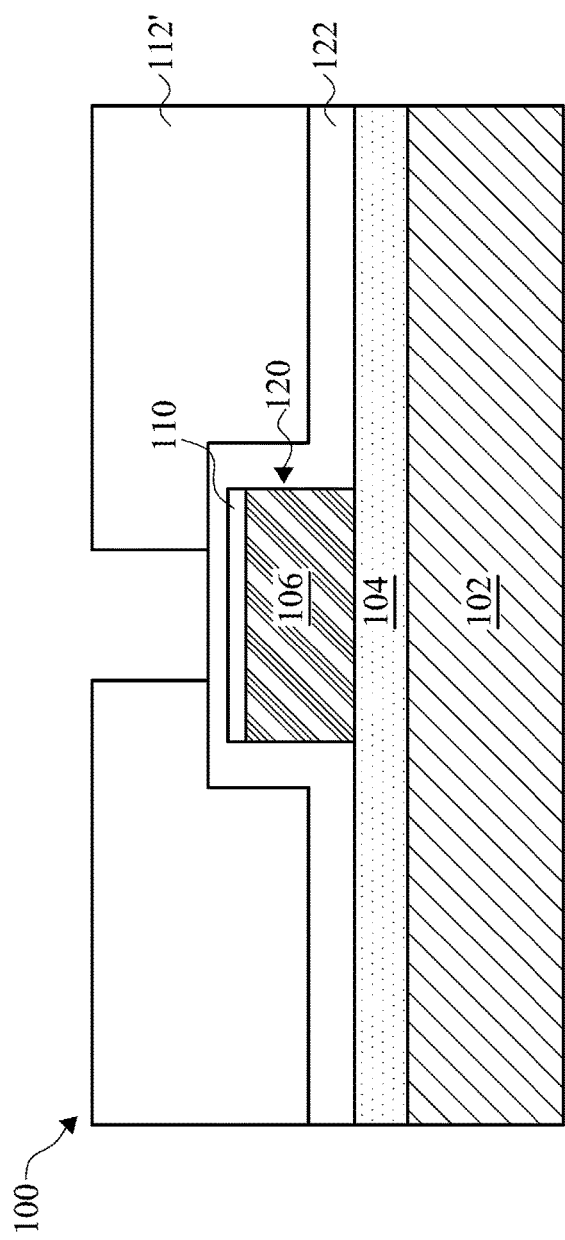

A layer of photoresist 112' is formed over the insulating material 122, as shown in FIG. 6. The layer of photoresist 112' is patterned using lithography with a pattern for an opening in the insulating material 122 over the contact pad 120. The patterning of the layer of photoresist 112' may comprise a similar process as described herein for the patterning of the layer of photoresist 112 shown in FIGS. 2 and 3, for example. The patterned layer of photoresist 112' is illustrated in FIG. 7.

Figure 8:
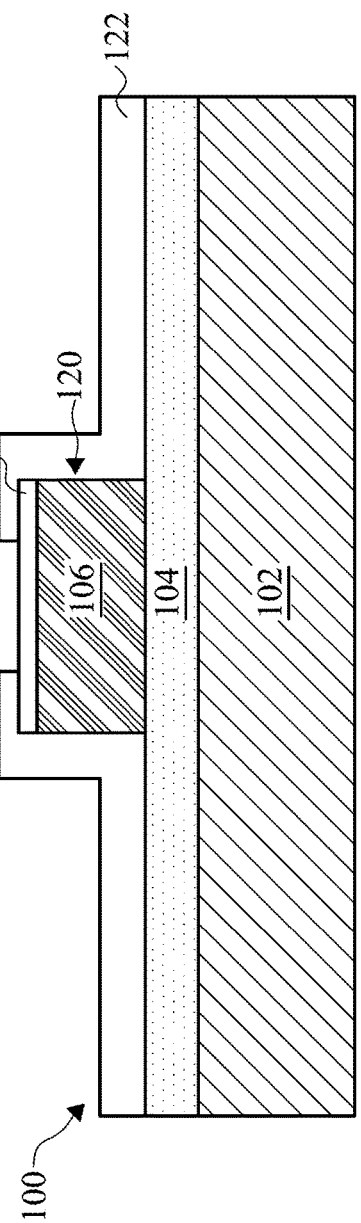

The patterned layer of photoresist 112' is then used as an etch mask to pattern the insulating material 122, as shown in FIG. 8. The etch process for the insulating material 122 may comprise a dry plasma etch process using $CF_4$, $C_2F_6$, or $CCl_2F_2$ or a wet chemical etch process using dilute HF or buffered HF in some embodiments, as examples. The etch process for the insulating material 122 may also comprise other chemistries and/or chemical compounds in some embodiments. The patterned layer of photoresist 112' is then removed using a suitable etch process and/or cleaning process, which is also shown in FIG. 8.

The etch process of the insulating material 122 forms an opening in the insulating material 122 over a portion of the contact pad 120. The opening in the insulating material 122 may comprise substantially the same shape, such as square, rectangular, or other shape, of the contact pad 120 in some embodiments. The opening in the insulating material 122 may also comprise a different shape than the contact pad 120. The opening in the insulating material 122 is smaller than the width of the contact pad 120 in some embodiments. The opening in the insulating material 122 may be smaller than the width of the contact pad 120 by at least a few μm over and along the edges of the contact pad 120 in some embodiments, for example.

Thus, in some embodiments, an insulating material 122 is disposed over the substrate 102 proximate the contact pad 120, as illustrated in FIG. 8. A portion of the insulating material 122 is disposed over edges of the contact pad 120 in some embodiments. In some embodiments, the contact pad 120 comprises a first width, and the opening in the insulating material 122 proximate the contact pad 120 comprises a second width, wherein the second width is less than the first width.

After the opening is made in the insulating material 122 over the passivation material 110 disposed over the contact pad 120, further processing of the semiconductor device may be performed. For example, additional back-end-of-line (BEOL) processes may be performed, such as forming, patterning, and processing additional material layers (not shown). Stress tests and other tests may also be performed. The semiconductor device 100 may be singulated into individual integrated circuit dies or packages and shipped to an end customer, as another example. The passivation material 110 left remaining on the surface of the contact pad 120 advantageously prevents and/or reduces corrosion of the contact pad 120 and also preserves bondability of the contact pad 120 during subsequent processing of the semiconductor device 100.

In some embodiments, after the manufacturing process of the semiconductor device 100 is complete, without removing the passivation material 110 or a portion thereof from the semiconductor device 100 and without removing the passivation material 110 or a portion thereof from over the contact pad 120, an electrical connection is made to the contact pad 120 through the passivation material 110. Some examples of electrical connections that may be made are wire bonding a wire 124 (see FIG. 9) or forming connectors 150 or contacts 150' (see FIG. 21) onto the contact pad 120. A method of implementing the semiconductor device 100 manufactured in accordance with the method described herein with reference to FIGS. 1 through 8 comprises making an electrical connection to the contact pad 120 through the passivation material 110 without removing the passivation material 110 or a portion thereof from over the contact pad 120 in accordance with some embodiments, for example.

Figure 9:
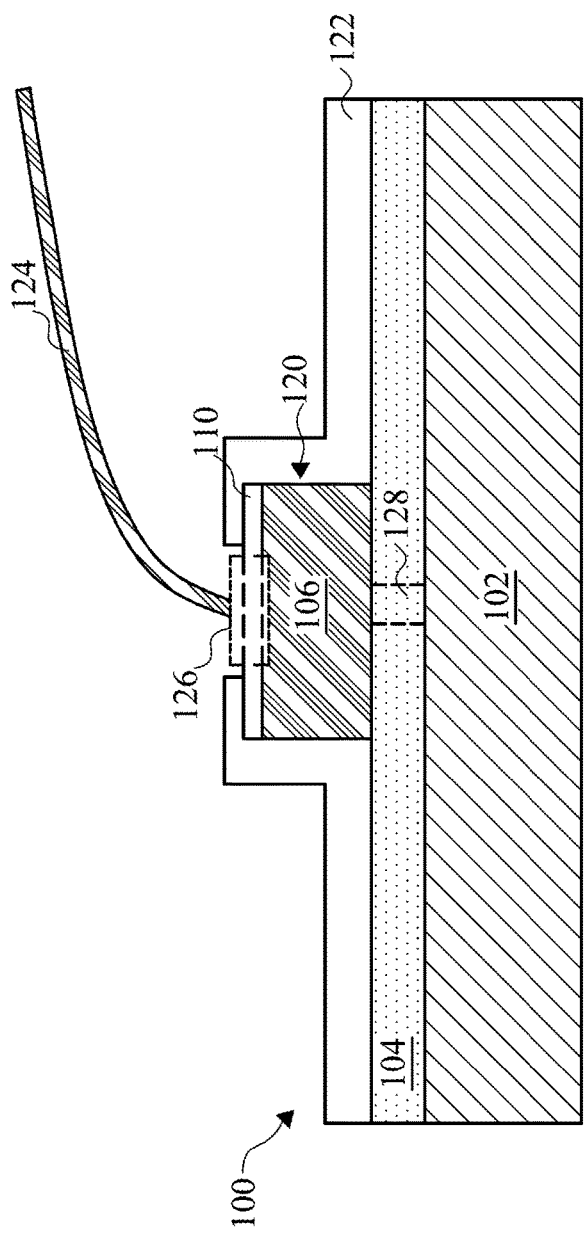
FIG. 9 is a cross-sectional view of a semiconductor device shown in FIG. 8 that illustrates a wire coupled to a contact pad through a passivation material disposed thereon in accordance with some embodiments.

For example, FIG. 9 is a cross-sectional view of the semiconductor device 100 shown in FIG. 8 that illustrates a wire 124 coupled to the contact pad 120 through the passivation material 110 in accordance with some embodiments. The wire 124 is coupled to the top surface of the contact pad 120 comprising conductive material 106 in a bond region 126. The bond region 126 comprises a width that is less than the width of the opening in the insulating material 122 in some embodiments. The bond region 126 may also comprise a width that is substantially the same as the width of the opening in the insulating material 122 in some embodiments. The wire 124 may comprise a conductive material such as Au, Cu, Al, Ag, other metals, or alloys or combinations thereof in some embodiments. The wire 124 may comprise a diameter of about 15 μm to several hundred μm, for example. The wire 124 may also comprise other materials and dimensions.

The passivation material 110 advantageously comprises a type of material and thickness that is sufficient for a wire 124 to be electrically and mechanically coupled to the contact pad 120 through the passivation material 110. In some embodiments, leaving the passivation material 110 remaining on the semiconductor device 100 during processing protects the contact pad 120 from damage and corrosion during various manufacturing and packaging processing steps, and transportation, for example. Furthermore, the portions of the passivation material 110 disposed around the bond region 126 continue to protect the contact pad 120 from corrosion, after the wire bonding process.

The wire 124 is wire bonded to the contact pad 120 through the passivation material 110 using a wire bonding process. The wire bonding process may comprise a ball bonding process, a wedge bonding process, or a compliant bonding process in some embodiments. In some embodiments, a thermosonic ball bonding process may be used for the wire bonding process, which utilizes a normal bond force simultaneously with thermal and ultrasonic energy to form a bond of the wire 124 to the contact pad 120. The normal force and ultrasonic power cause a break in the passivation material 110 and/or diffusion of a material of the wire 124 through the passivation material 110 to the contact pad 120, for example. Other factors and parameters of the wire bond process may be selected to achieve a break in the passivation material 110 and form the wire bond.

FIG. 9 also illustrates a conductive feature 128 disposed in the insulating material 104 beneath the contact pad 120. The conductive feature 128 is shown in phantom, e.g., in dashed lines, in FIG. 9. The conductive feature 128 may comprise a via or other segment of conductive material that is adapted to provide and/or make an electrical connection from the contact pad 120 to circuitry formed within or over the substrate 102, through the insulating material 104. The conductive feature 128 may be electrically coupled to an underlying interconnect structure within the substrate 102, and the interconnect structure may be coupled to the circuitry formed within or over the substrate 102, for example.

Before the conductive material 106 is formed over the insulating material 104 as shown in FIG. 1, the conductive feature 128 is formed in the insulating material 104. The conductive feature 128 may be formed using a subtractive etch process, by forming a layer of conductive material over the substrate 102 and patterning the layer of conductive material using lithography, forming the conductive feature 128. The insulating material 104 is then formed around the conductive feature 128. The conductive feature 128 may also be formed using a damascene process, by forming the insulating material 104 over the substrate 102, and patterning the insulating material 104 using a lithography process. A conductive material is then formed within the insulating material 104, forming the conductive feature 128. A plating process may also be used to form the conductive feature 128 in the insulating material 104, for example. The conductive feature 128 may also be formed using other methods.

Figure 10:
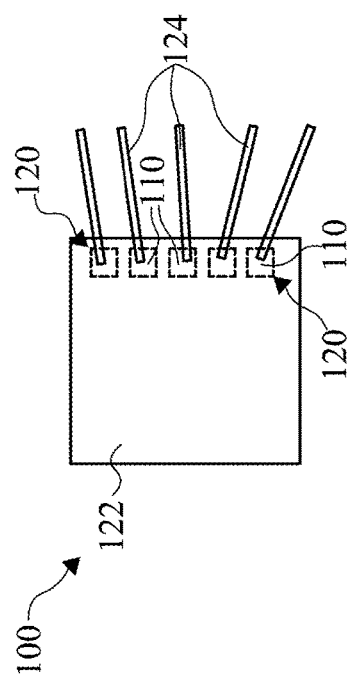
FIG. 10 is a top view of some embodiments illustrated in FIG. 9.

FIG. 10 is a top view of some of the embodiments illustrated in FIG. 9. A plurality of the contact pads 120 disposed over the substrate 102 is shown. The passivation material 110 is disposed over each of the plurality of contact pads 120. A wire 124 is wire bonded to each of the contact pads 120 through the passivation material 110. Likewise, a connector 150 or contact 150' (see FIG. 21) may be coupled to each of the plurality of contact pads 120 through the passivation material 110. There may be several contact pads 120, e.g., ten or less, ten or more, dozens, or hundreds of contact pads 120 formed on a surface of a semiconductor device 100, depending on the application and number of input/output signals and/or power and ground signals of the semiconductor device 100, for example. A row of contact pads 120 disposed along one edge or side of the semiconductor device 100 is illustrated in FIG. 10. The plurality of contact pads 120 may also be arranged in a single row or multiple rows along one or more edges of the semiconductor device 100 in some embodiments, for example.

An additional advantage of some of the embodiments shown in FIGS. 1 through 10 is that the passivation material 110 is disposed on a top surface of the conductive material 106 during the etch process used to form the contact pad 120. Thus, the passivation material 110 prevents the top surface of the contact pad 120 from exposure to the etch chemistries used in the etch process for the contact pad 120, and thus prevents corrosion of the contact pad 120 during the etch process. The passivation material 110 also protects the contact pad 120 from being contacted by other chemicals or etch chemistries during other processes for the semiconductor device 100 in some embodiments, for example.

Figure 11:
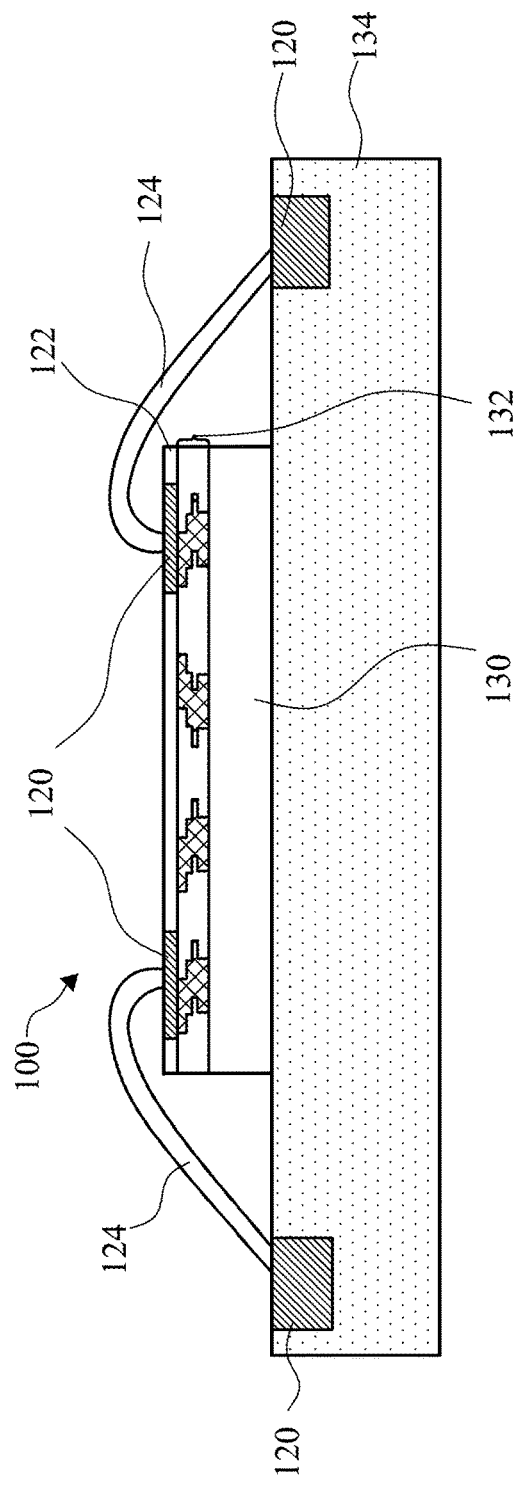
FIGS. 11 through 13 are cross-sectional views showing semiconductor devices that include the contact pads having a passivation material disposed thereon in accordance with some embodiments.
Figure 12:
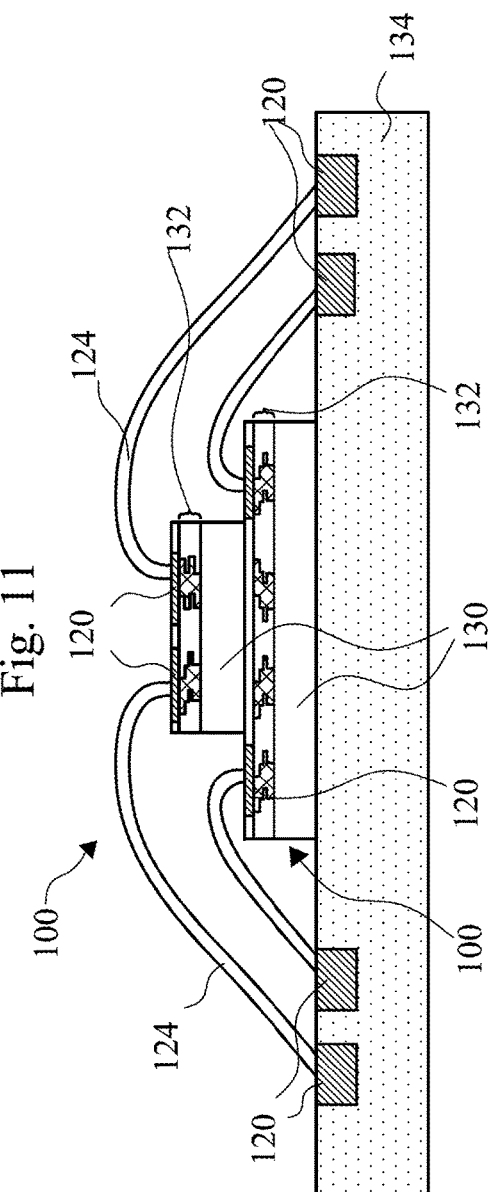
Figure 13:
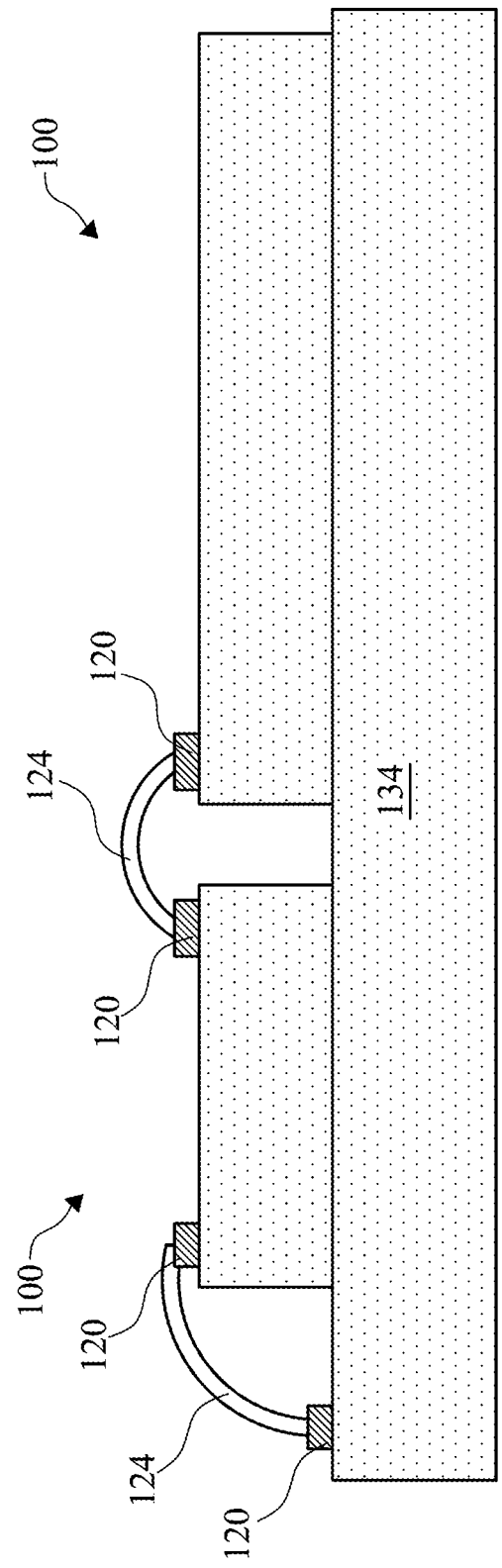

In some embodiments wherein electrical connection is made through the passivation material 110 to the contact pad 120 using a wire bond, an opposite end of the wire 124 may be made to another semiconductor device 134 or object. For example, the semiconductor device 100 illustrated in FIG. 9 may comprise a first semiconductor device 100, and an opposite end of the wire 124 shown in FIG. 9 may be coupled to a contact pad disposed on a second semiconductor device 134, as shown in FIGS. 11 through 13. Note that for simplicity of the drawings, the passivation material 110 is not shown in FIGS. 11 through 14.

The second semiconductor device 134 may comprise an integrated circuit die, a packaged integrated circuit die, a package for an integrated circuit die, a packaging substrate, a PCB, or other types of devices. For example, in some embodiments wherein making the electrical connection to the contact pad 120 comprises wire bonding a wire 124 to the contact pad 120 of a first semiconductor device 100 through the passivation material 110, making the electrical connection may comprise coupling a first end of the wire 124 to the contact pad 120, and a second end of the wire 124 may be coupled to a contact pad of a second semiconductor device 134.

In some embodiments, the second semiconductor device 134 may also have contact pads 120 with the passivation material 110 described here formed thereon, and an electrical connection may be made to the contact pads 120 through the passivation material 110 without requiring an extra processing step to remove the passivation material 110. In some embodiments, the second semiconductor device 134 may not have contact pads 120 with the passivation material 110 described here formed thereon. In some embodiments, the second semiconductor devices 134 illustrated in FIGS. 11 through 13 may have contact pads 120 with the passivation material 110 described here formed thereon, and the first semiconductor devices 100 may not have contact pads 120 with the passivation material 110 described here formed thereon, as another example.

In FIG. 11, the first semiconductor device 100 comprises an integrated circuit die 130 that includes an interconnect structure 132 formed thereon. The interconnect structure 132 comprises a plurality of conductive lines and vias formed in an insulating material layer or layers. The contact pads 120 described herein that have the passivation material 110 disposed thereon are formed over the interconnect structure 132. The first semiconductor device 100 comprising the integrated circuit die 130 is coupled to a second semiconductor device 134 that comprises a packaging substrate, a package for an integrated circuit die, or a PCB. The first semiconductor device 100 is coupled to a surface of the second semiconductor device 134, and wires 124 are wire bonded to contact pads 120 of the first semiconductor device 100 at one end and to contact pads 120 of the second semiconductor device 134 at an opposite end.

FIG. 12 illustrates some embodiments of the present disclosure wherein multiple semiconductor devices are stacked or packaged vertically. Two first semiconductor devices 100 comprising integrated circuit dies are stacked and are then coupled to a surface of a second semiconductor device 134. Wires 124 are wire bonded to contact pads 120 of the first semiconductor devices 100 at one end and to contact pads 120 of the second semiconductor device 134 at an opposite end.

FIG. 13 illustrates some embodiments wherein multiple semiconductor devices 100 are stacked or packaged horizontally. Two first semiconductor devices 100 comprising integrated circuit dies or other types of devices are coupled to a surface of a second semiconductor device 134. Wires 124 may be wire bonded to contact pads 120 of the first semiconductor devices 100 at one end and to contact pads 120 of the second semiconductor device 134 at an opposite end. Wires 124 may also be wire bonded to contact pads 120 of one of the first semiconductor devices 100 at one end and to contact pads 120 of the other one of the first semiconductor devices 100 at an opposite end.

Figure 14:
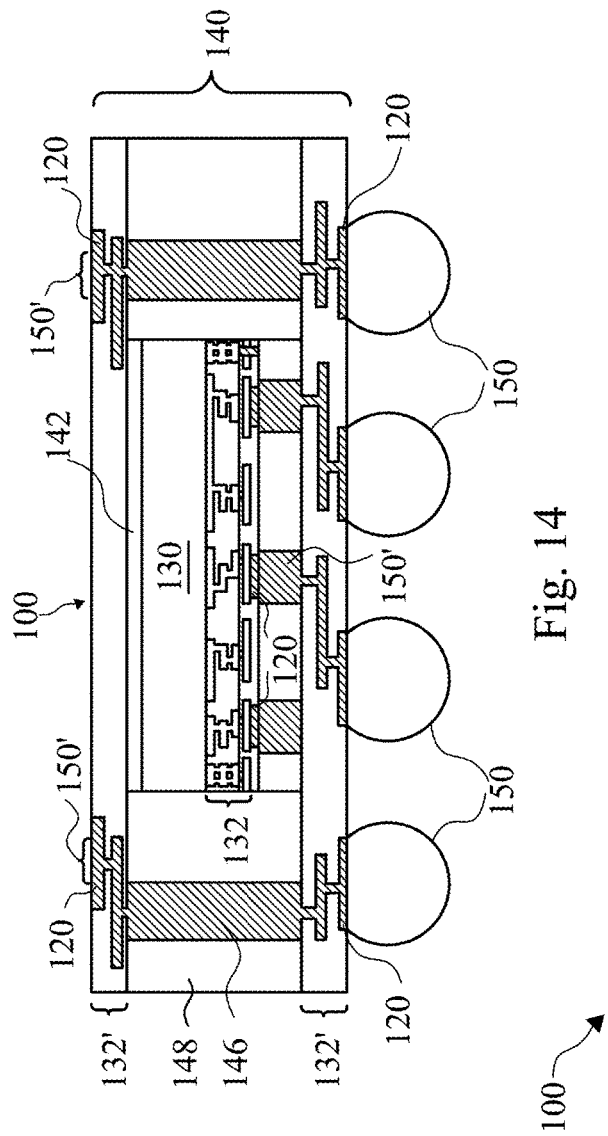
FIG. 14 illustrates a cross-sectional view of a packaged semiconductor device that includes contact pads with a passivation material disposed thereon, wherein a connector or contact is coupled to the contact pads, in some embodiments.

FIG. 14 illustrates a cross-sectional view of a packaged semiconductor device 140 that includes contact pads 120 with a passivation material 110 disposed thereon, wherein connectors 150 or contacts 150' are coupled to the contact pads 120 through the passivation material 110, in some embodiments. The materials and formation methods of the connectors 150 and contacts 150' will be described further herein with respect to FIG. 21. Wires 124 may also be wire bonded to the contact pads 120 of the packaged semiconductor device 140 through the passivation material 110, not shown.

The packaged semiconductor device 140 includes a semiconductor device 100 comprising an integrated circuit die 130 having an interconnect structure 132 formed thereon. The contact pads 120 comprising a passivation material 110 disposed thereon are disposed on a surface of the interconnect structure 132. Contacts 150' are formed on the contact pads 120 through the passivation material 110.

The semiconductor device 100 is encapsulated in a molding material 148. A plurality of through-vias 146 may also be formed in the molding material 148. The plurality of through-vias 146 comprise a conductive material and may provide vertical connections for the packaged semiconductor device 140, for example. In some embodiments, the plurality of through-vias 146 is not included in a packaged semiconductor device 140.

The molding material 148 is disposed around the through-vias 146 and semiconductor device 100. The molding material 148 encapsulates the through-vias 146 and the semiconductor device 100 in some embodiments, for example. The molding material 148 may comprise a molding compound comprised of an insulating material, such as an epoxy, a filler material, a stress release agent (SRA), an adhesion promoter, other materials, or combinations thereof, as examples. The molding material 148 may comprise a liquid or gel when applied so that it flows between and around the through-vias 146 and the semiconductor device 100, in some embodiments. The molding material 148 is then cured or allowed to dry so that it forms a solid. A molding compound clamp may be applied during a curing process and a plasma treatment process of the molding material 148 in some embodiments. In some embodiments, as deposited, the molding material 148 extends over surfaces of the through-vias 146 and the semiconductor device 100. After the molding material 148 is applied, excess portions of the molding material 148 are removed using a planarization process, such as a chemical mechanical polish (CMP) process, a grinding process, an etch process, or combinations thereof, as examples. Other methods may also be used to planarize the molding material 148. A portion of the through-vias 146 and/or the semiconductor device 100 may also be removed during the planarization process for the molding material 148. In some embodiments, an amount of the molding material 148 applied may be controlled so that surfaces of the through-vias 146 and the semiconductor device 100 are exposed. Other methods may also be used to form the molding material 148.

An interconnect structure 132' comprising a plurality of conductive lines and vias formed in one or more insulating materials may be formed on one side or on both sides of the semiconductor device 100, through-vias 146, and the molding material 148. In some of the embodiments shown in FIG. 14, an interconnect structure 132' is formed on both sides of the semiconductor device 100, through-vias 146, and the molding material 148, for example. The interconnect structure 132' provides horizontal connections for the packaged semiconductor device 140 in some embodiments.

In some embodiments, contact pads 120 may be formed on the interconnect structure(s) 132', wherein the contact pads 120 include the passivation material 110 disposed thereon. Connectors 150 and/or contacts 150' may be formed on the contact pads 120 of the interconnect structure(s) 132', through the passivation material 110. In some embodiments, connectors 150 and/or contacts 150' are formed on one, two, or all of the interconnect structures 132 and 132' shown. In some embodiments, wires 124 (not shown; see FIGS. 11 through 13) may be used to make electrical connections to the contact pads 120 through the passivation material 110.

A carrier, not shown, may be used to package the semiconductor device 100. For example, the plurality of through-vias 146 may be formed over a carrier, and the integrated circuit die 130 including contacts 120 formed thereon, in some embodiments, may be coupled to the carrier using a die attach film (DAF) or glue 142. The molding material 148 is formed around the through-vias 146 and the integrated circuit die 130, and an interconnect structure 132' (e.g., the bottom interconnect structure 132' in the view shown in FIG. 14) is formed over the molding material 148, through-vias 146, and contacts 150' formed on the contacts 120 through the passivation material 110, for example. Connectors 150 are formed on the contacts 120 of the interconnect structure 132' in some embodiments, and the carrier is removed. A second carrier may be coupled to the connectors 150 coupled to the interconnect structure 132', and the top interconnect structure 132' may or may not be formed on the opposite side of the packaged semiconductor device 140. Other orders of processing steps and methods may also be used to package the semiconductor device 100.

The contact pads 120 that include the passivation material 110 disposed thereon may also be implemented in other types of devices and packages, such as package-on-package (POP) devices, system-on-a-chip (SOC) devices, chip-on-wafer-on substrate (CoWoS) devices, as examples.

FIGS. 15 through 21 are cross-sectional views of a semiconductor device 100 at various stages of manufacturing that illustrate a method of forming a contact pad 120 in accordance with some embodiments of the present disclosure. The conductive material 106 is patterned to form the contact pad 120 before the passivation material 110 is formed in some of these embodiments.

Figure 15:
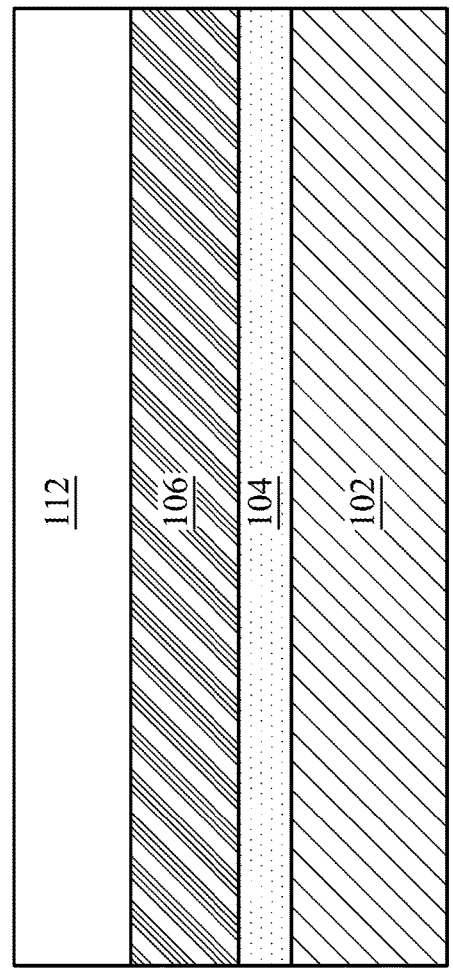

In FIG. 15, the conductive material 106 shown in FIG. 1 is formed over the insulating material 104 which is formed over the substrate 102. The layer of photoresist 112 described for FIG. 2 is formed directly over the conductive material 106. The layer of photoresist 112 is patterned, as shown in FIG. 16 and as described for FIG. 3. The layer of photoresist 112 is used as an etch mask for the conductive material 106, forming a contact pad 120 from the conductive material 106, as shown in FIG. 17.

Figure 18:
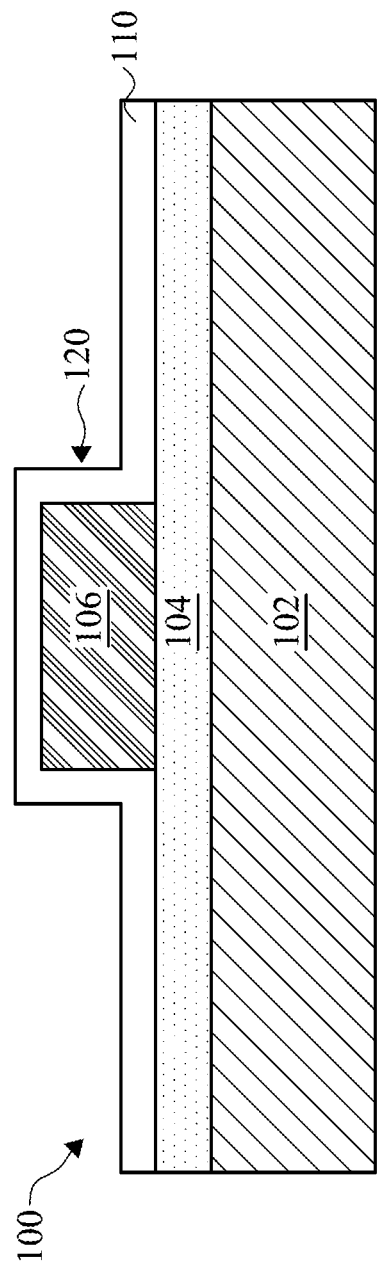

The passivation material 110 is formed over the contact pad 120 and over exposed portions of the insulating material 104, as shown in FIG. 18. The passivation material 110 is formed over the top surface and sidewalls of the contact pad 120.

In some embodiments, the passivation material 110 is then patterned (not shown). For example, in some embodiments wherein the passivation material 110 comprises a conductive material, such as TiN, the passivation material 110 may be patterned using lithography to prevent shorting between adjacent contact pads 120, not shown in the drawings. The passivation material 110 may be patterned by forming a layer of photoresist 112 over the passivation material 110 as shown in FIG. 2, patterning the layer of photoresist 112 as shown in FIG. 3, and then using the layer of photoresist 112 as an etch mask during an etch process for the passivation material 110. The layer of photoresist 112 is then removed.

The passivation material 110 may be left residing on top surfaces of the contact pad 106 or on top surfaces and sidewalls of the contact pad 106. In some embodiments, the pattern of the passivation material 110 may be larger than the pattern of the contact pad 106. A portion of the passivation material 110 may be left residing over the surface of the insulating material 104 proximate the contact pad 106 in some embodiments, as another example.

Figure 19:
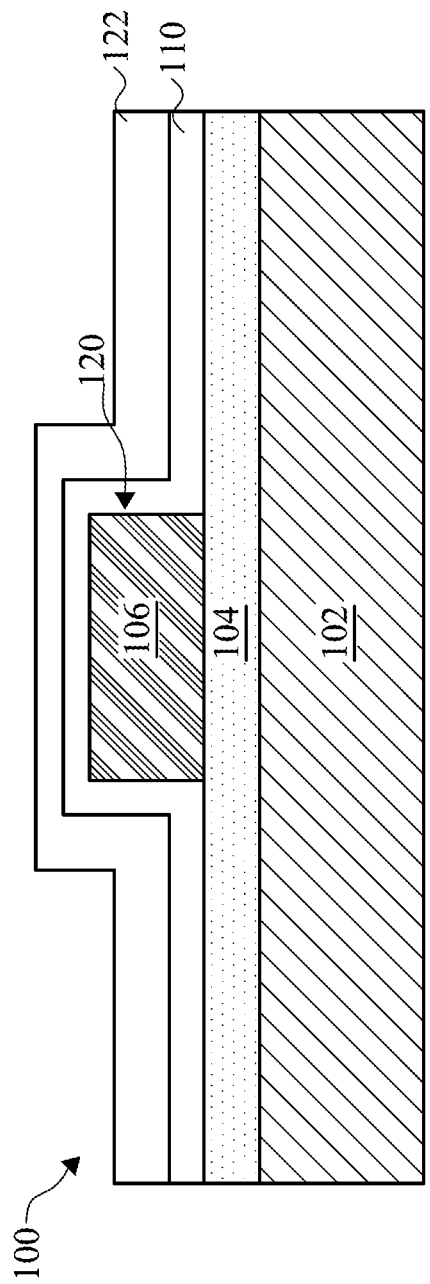
Figure 20:
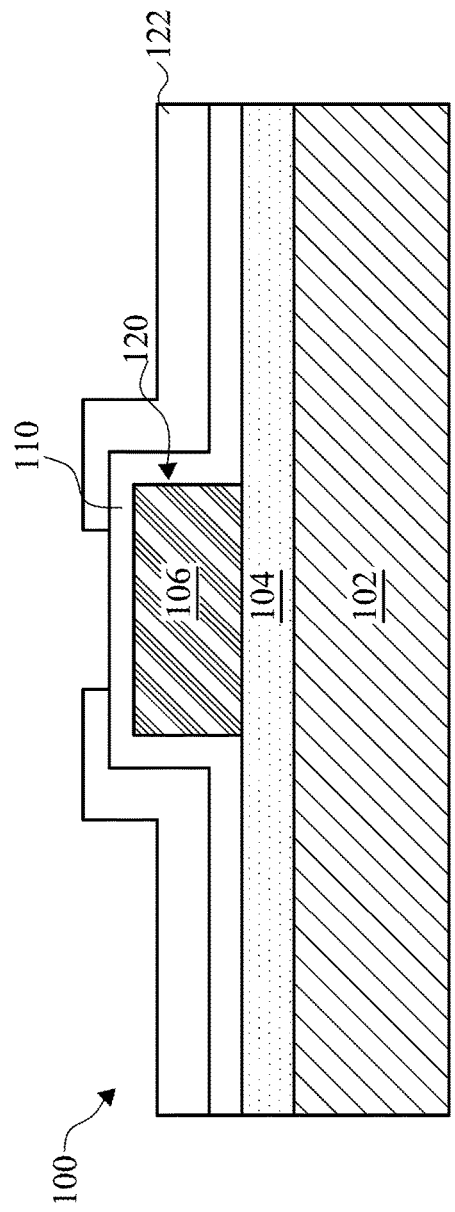
Figure 21:
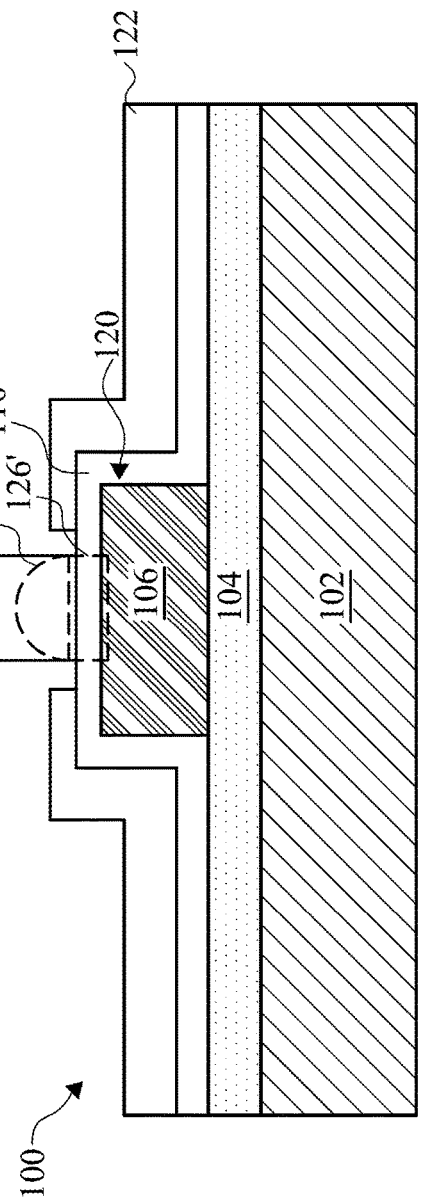

In other embodiments, the passivation material 110 is not patterned, e.g., in some embodiments wherein the passivation material 110 is not conductive, as illustrated in FIGS. 19, 20, and 21.

The manufacturing process steps described for FIGS. 5 through 8 are then performed. For example, in FIG. 19, insulating material 122 is formed over the passivation material 110. The insulating material 122 is patterned to form an opening in the insulating material 122 over the passivation material 110 disposed over the contact pad 120, as shown in FIG. 20.

An electrical connection may be made to the semiconductor device 100 to the contact pad 120 through the passivation material 110. A wire 124 may be wire bonded to the contact pad 120 through the passivation material 110, as described for and shown in FIG. 9. FIG. 21 illustrates some embodiments of the present disclosure wherein an electrical connection is made to the contact pad 120 by coupling a connector 150 or a contact 150' to the contact pad 120 through the passivation material 110 in a bond region 126'. The method of forming the connector 150 or contact 150' is selected in some embodiments so that removal of the passivation material 110 or a portion thereof is not required. For example, a normal force, friction, or heat, as examples, may be applied when coupling the connector 150 or contact 150' to the contact pad 120. A material and thickness of the passivation material 110 may be selected so that a material of the connector 150 or contact 150' is adapted to diffuse through or break through the passivation material 110 and form a mechanical and electrical connection, for example. The connectors 150 or contacts 150' may comprise microbumps, controlled collapse chip connection (C4) bumps, solder bumps, solder balls, or other types of connectors 150 or contacts 150'. In some embodiments, the connectors 150 or contacts 150' may comprise stud bumps comprised of a conductive material or a metal such as gold or other materials, wherein an ultrasonic force, normal force, and/or heat are applied to break through the passivation material 110, as another example.

The connectors 150 or contacts 150' may comprise a eutectic material such as solder in some embodiments. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials may be formed from SnCu compounds as well, without the use of silver (Ag). Lead-free solder connectors may also include tin and silver, Sn—Ag, without the use of copper. The connectors 150 or contacts 150' may be formed by a deposition process such as a solder ball drop with pressure and/or heat to break the passivation material 110 and/or cause diffusion of the connectors 150 or contacts 150' material, for example. The connectors or contacts 150' may also be formed by other methods and may comprise other materials.

Connectors 150 or contacts 150' may also be electrically coupled to contact pads 120 through the passivation material 110 for the embodiments illustrated in FIGS. 1 through 8, for example.

Figure 22:
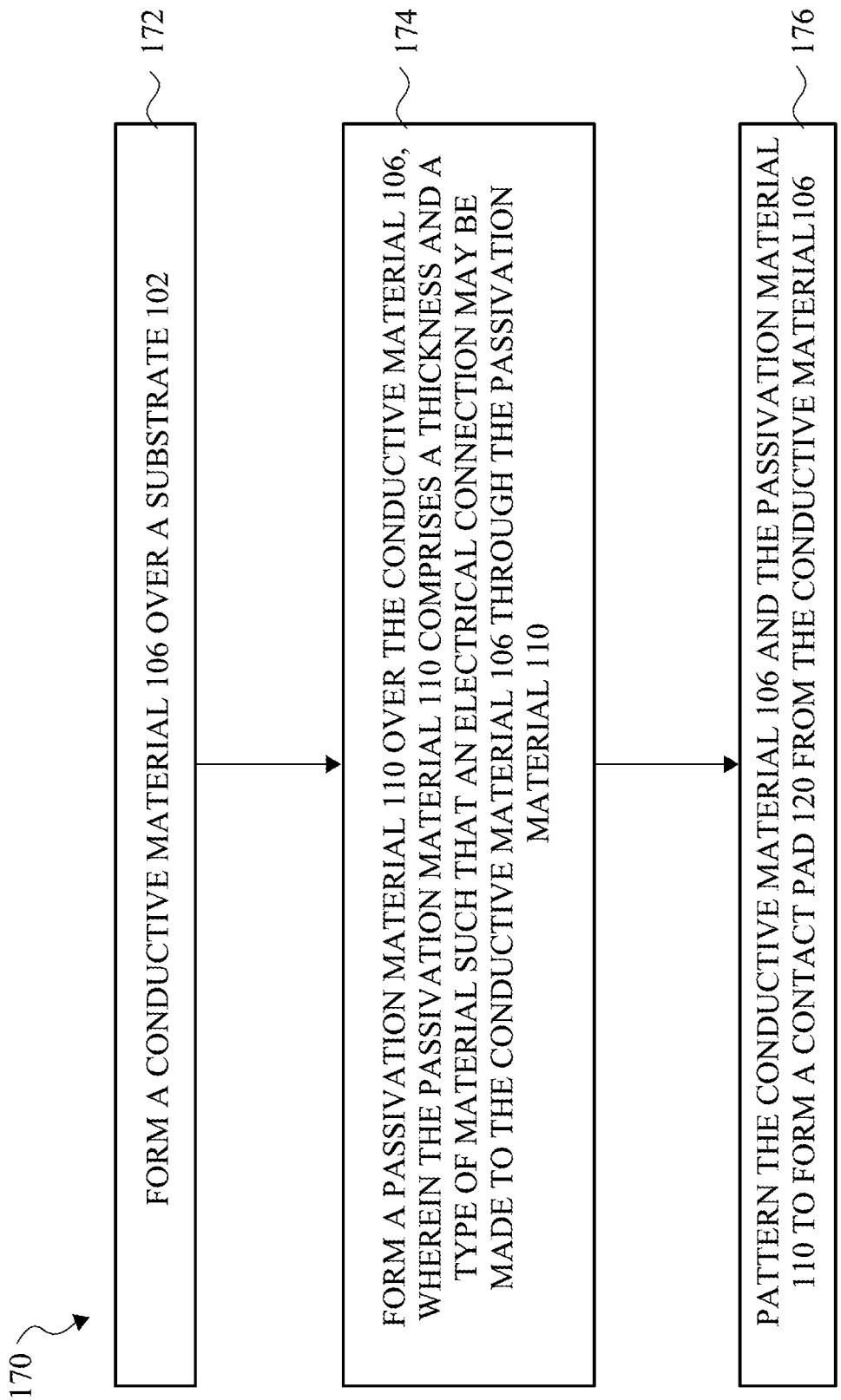
FIG. 22 is a flow chart that illustrates a method of manufacturing a semiconductor device in accordance with some embodiments of the present disclosure.

FIG. 22 is a flow chart 170 that illustrates a method of manufacturing a semiconductor device 100 in accordance with some embodiments of the present disclosure. In step 172, a conductive material 106 is formed over a substrate 102. In step 174, a passivation material 110 is formed over the conductive material 106, wherein the passivation material 110 comprises a thickness and a type of material such that an electrical connection may be made to the conductive material 106 through the passivation material 110. In step 176, the conductive material 106 and the passivation material 110 are patterned to form a contact pad 120 from the conductive material 106.

Some embodiments of the present disclosure include semiconductor devices 100 that include the passivation material 110 disposed over a contact pad 120. Some embodiments of the present disclosure include a wire 124, connector 150, or contact 150' coupled to the contact pad 120 through the passivation material 110. Some embodiments comprise methods of manufacturing semiconductor devices 100 that include the passivation material 110 disposed over a contact pad 120.

Advantages of some embodiments of the present disclosure include providing semiconductor devices with improved contact pads due to inclusion of the passivation material in the structure over the contact pads, which prevents or reduces corrosion of the contact pads during various processing steps, e.g., from humidity, water, cleaning processes, chemical processes, exposure to other substances, singulation, and/or thermal cycling, as examples. The passivation material comprises a type of material and a thickness sufficient for an electrical and mechanical connection may be made through the passivation material to the contact pads. An additional processing step to remove the passivation material so that a connection may be made to the contact pads is advantageously avoided. Portions of the passivation material not utilized for making the electrical and mechanical connection to the contact pads provide further corrosion prevention and/or reduction, after electrical connection is made to the contact pads. The materials and application methods for the passivation materials are inexpensive and available in semiconductor manufacturing and processing facilities. Furthermore, the methods, structures, and devices described herein are easily implementable into existing semiconductor device manufacturing and packaging process flows and structures.

In some embodiments, a method includes forming a contact pad over a semiconductor device, and forming a passivation material over the contact pad. The passivation material comprises a thickness and a type of material such that an electrical connection may be made to the contact pad through the passivation material.

In some embodiments, a method of manufacturing a semiconductor device includes forming a conductive material over a substrate, and forming a passivation material over the conductive material. The passivation material comprises a thickness and a type of material such that an electrical connection may be made to the conductive material through the passivation material. The method includes patterning the passivation material and the conductive material to form a contact pad from the conductive material.

In some embodiments, a semiconductor device includes a substrate, a contact pad disposed over the substrate, and a passivation material disposed over the contact pad. A wire, connector, or contact is coupled to the contact pad through the passivation material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a contact pad over a semiconductor device;
   forming a passivation material over the contact pad;
   forming an insulating layer over and laterally adjacent the passivation material;
   patterning the insulating layer to expose an uppermost surface of the passivation material; and
   after patterning the insulating layer, forming a solder connector on the uppermost surface of the passivation material, wherein forming the solder connector comprises:
      performing a solder ball drop process with heat or pressure on the uppermost surface of the passivation material, wherein the solder ball drop process with heat or pressure causes solder material of the solder connector to diffuse through the passivation material to the contact pad to form an electrical connection between the solder connector and the contact pad leaving passivation material covering the surface of the contact pad and thereby reducing corrosion and preserving bondability of the contact pad.

2. The method according to claim 1, wherein forming the passivation material comprises forming a material selected from the group consisting essentially of Ti, TiN, TaN, $Al_2O_3$, $Ta_2O_3$, $HfO_2$, $TiO_2$, and combinations thereof.

3. The method according to claim 1, wherein forming the passivation material comprises forming a material comprising a thickness of about 10 Angstroms to about 1,400 Angstroms.

4. The method according to claim 1, wherein forming the passivation material comprises forming the passivation material using physical vapor deposition (PVD) or chemical vapor deposition (CVD).

5. The method according to claim 1, wherein the semiconductor device comprises an integrated circuit die, a packaged integrated circuit die, a package for an integrated circuit die, a packaging substrate, or a printed circuit board (PCB).

6. The method according to claim 1, wherein forming the passivation material comprises forming the passivation material over a top surface of the contact pad, or wherein forming the passivation material comprises forming the passivation material over a top surface and sidewalls of the contact pad.

7. A method of manufacturing a semiconductor device, the method comprising:
   forming a conductive material over a substrate;
   forming a passivation material over the conductive material, wherein the passivation material extends along outermost sidewalls of the conductive material;
   patterning the passivation material and the conductive material to form a contact pad, wherein the patterning removes the passivation material from the outermost sidewalls of the conductive material, wherein after the patterning, the passivation material has outermost sidewalls that are coterminous with the outermost sidewalls of the conductive material, wherein the contact pad comprises patterned passivation material and patterned conductive material;
   after patterning the passivation material and the conductive material, attaching a connector to the contact pad, wherein the patterned passivation material is interposed between and separates the connector from the patterned conductive material; and
   diffusing material of the connector o through the patterned passivation material to the patterned conductive material to form an electrical connection between the connector and the patterned conductive material.

8. The method according to claim 7, wherein forming the conductive material comprises forming a material selected from the group consisting essentially of AlCu, AlSi, Al, Cu, and combinations thereof.

9. The method according to claim 7, wherein patterning the passivation material and the conductive material comprises using a lithography process.

10. The method according to claim 7, wherein the substrate comprises circuitry formed within or over the substrate, and wherein the method further comprises forming an insulating material over the substrate, before forming the conductive material, and making an electrical connection from the conductive material to the circuitry through the insulating material.

11. A method of implementing a semiconductor device manufactured according to the method of claim 7, the method comprising: without removing the passivation material or a portion thereof from over the contact pad, making an electrical connection to the contact pad through the passivation material.

12. The method according to claim 11, wherein making the electrical connection to the contact pad comprises wire bonding a wire to the contact pad through the passivation material.

13. The method according to claim 12, wherein the semiconductor device comprises a first semiconductor device, wherein making the electrical connection comprises coupling a first end of the wire to the contact pad of the first semiconductor device, wherein the method further comprises coupling a second end of the wire to a contact pad of a second semiconductor device, and wherein the second end of the wire is opposite the first end of the wire.

14. The method according to claim 11, wherein making the electrical connection to the contact pad comprises coupling a connector or a contact to the contact pad through the passivation material.

15. A method comprising:
  forming a contact pad layer over a substrate;
  forming a conductive passivation layer over and on the contact pad layer, the conductive passivation layer being a conformal layer;
  patterning the contact pad layer and the conductive passivation layer to form a contact pad, wherein after the patterning, the conductive passivation layer has outermost sidewalls that are coterminous with outermost sidewalls of the contact pad layer, wherein the contact pad comprises patterned portions of the contact pad layer and patterned portions of the conductive passivation layer;
  forming an insulating material over the contact pad, the insulating material being a conformal layer;
  patterning the insulating material to form an opening in the insulating material, wherein the opening exposes an uppermost surface of the conductive passivation layer; and
  attaching a connector to the contact pad, wherein the conductive passivation layer:
    is interposed between the connector and the contact pad layer within the opening; and
    separates at least a portion of the connector from the contact pad layer.

16. The method of claim 15, wherein forming the conductive passivation layer includes depositing one or more layers selected from the group consisting of Ti, TiN, TaN, $Al_2O_3$, $Ta_2O_3$, $HfO_2$, $TiO_2$, and combinations thereof.

17. The method of claim 15, further comprising forming a patterned insulating material over the contact pad, the patterned insulating material exposing a portion of the contact pad.

18. The method of claim 15, wherein attaching a connector includes wire bonding a wire to the contact pad.

19. The method of claim 15, wherein the contact pad layer and the conductive passivation layer are patterned in a same step.

20. The method of claim 15, wherein the contact pad layer is patterned to form a patterned contact and the conductive passivation layer is deposited on the patterned contact.

* * * * *